US010224352B2

(12) United States Patent
Lee

(10) Patent No.: US 10,224,352 B2
(45) Date of Patent: Mar. 5, 2019

(54) INTEGRAL OPTICAL SENSOR PACKAGE

(75) Inventor: Hyun Young Lee, Daejeon (KR)

(73) Assignee: RAYTRON CO., LTD., Daejeon (KR)

( * ) Notice: Subject to any disclaimer, the term of this patent is extended or adjusted under 35 U.S.C. 154(b) by 433 days.

(21) Appl. No.: 14/232,782

(22) PCT Filed: Jul. 17, 2012

(86) PCT No.: PCT/KR2012/005683
§ 371 (c)(1),
(2), (4) Date: Jan. 14, 2014

(87) PCT Pub. No.: WO2013/162125
PCT Pub. Date: Oct. 31, 2013

(65) Prior Publication Data
US 2015/0034804 A1 Feb. 5, 2015

(30) Foreign Application Priority Data

Apr. 23, 2012 (KR) .................. 10-2012-0042095
Jun. 19, 2012 (KR) .................. 10-2012-0065385

(51) Int. Cl.
G01J 1/42 (2006.01)
H01L 27/144 (2006.01)
(Continued)

(52) U.S. Cl.
CPC ........ H01L 27/1443 (2013.01); G01J 1/0411 (2013.01); G01J 1/4228 (2013.01); G08C 23/04 (2013.01); H01L 31/02002 (2013.01); H01L 31/0203 (2013.01); H01L 31/02327 (2013.01); H01L 25/167 (2013.01); H01L 2224/45144 (2013.01); H01L 2224/48091 (2013.01); H01L 2224/48137 (2013.01);
(Continued)

(58) Field of Classification Search
CPC ............ G01J 1/4228; G01J 2001/4233; G08C 23/04; H01L 31/02327
USPC ........................................................ 250/208.2
See application file for complete search history.

(56) References Cited

U.S. PATENT DOCUMENTS 4,423,936 A * 1/1984 Johnson .................. G03B 7/16
396/123
6,107,618 A 8/2000 Fossum et al.
(Continued)

FOREIGN PATENT DOCUMENTS

JP    H05-159871 A    6/1996
JP    2001-264161 A   9/2001
KR    10-0564947 B1   3/2006

OTHER PUBLICATIONS

International Search Report for PCT/KR2012/005683.

Primary Examiner — Thanh Luu
(74) Attorney, Agent, or Firm — The PL Law Group, PLLC

(57) ABSTRACT

The present invention relates to an integral optical sensor package. More particularly, the present invention relates to an integral optical sensor package in which a light sensor for receiving a visible light band and a remote control sensor for receiving a light signal of an IR band are integrated such that the two sensors may receive the light of the unique light bands thereof without mutual interference. Further, a light-emitting means for indicating the operation of the remote control sensor can be integrated with the light sensor and the remote control sensor, thus reducing the number of processes and costs for manufacturing an apparatus.

5 Claims, 7 Drawing Sheets

(51) Int. Cl.
  *G01J 1/04* (2006.01)
  *G08C 23/04* (2006.01)
  *H01L 31/02* (2006.01)
  *H01L 31/0232* (2014.01)
  *H01L 31/0203* (2014.01)
  *H01L 25/16* (2006.01)

(52) U.S. Cl.
  CPC ........... *H01L 2224/48247* (2013.01); *H01L 2224/8592* (2013.01); *H01L 2924/12044* (2013.01)

(56) References Cited

U.S. PATENT DOCUMENTS

| | | | | |
|---|---|---|---|---|
| 6,108,051 | A * | 8/2000 | Iwai | H04N 5/64 348/734 |
| 6,335,548 | B1 * | 1/2002 | Roberts | H01L 23/49562 250/239 |
| 2002/0154366 | A1 * | 10/2002 | Horio | H01L 25/167 398/121 |
| 2006/0071289 | A1 * | 4/2006 | Tanaka | H01L 31/02002 257/432 |
| 2006/0123150 | A1 * | 6/2006 | Iwai | G06Q 10/10 710/15 |
| 2008/0013961 | A1 * | 1/2008 | Yee | H04B 10/1141 398/164 |
| 2009/0159799 | A1 * | 6/2009 | Copeland | G01J 3/36 250/338.1 |
| 2010/0012953 | A1 * | 1/2010 | Saito | H01L 23/49537 257/82 |
| 2010/0273530 | A1 * | 10/2010 | Jarvis | F16F 1/027 455/566 |
| 2010/0282953 | A1 * | 11/2010 | Tam | G01J 1/1626 250/226 |
| 2011/0002587 | A1 * | 1/2011 | Bogner | H01L 25/167 385/93 |
| 2011/0297831 | A1 * | 12/2011 | Yao | G01S 7/4813 250/338.4 |
| 2012/0001841 | A1 * | 1/2012 | Gokingco | G01J 1/32 345/102 |
| 2015/0001693 | A1 * | 1/2015 | Meadowcroft | H01L 23/49568 257/668 |

* cited by examiner

INTEGRAL OPTICAL SENSOR PACKAGE

CROSS REFERENCE TO RELATED APPLICATIONS AND CLAIM OF PRIORITY

This patent application is a National Phase application under 35 U.S.C. § 371 of International Application No. PCT/KR2012/005683, filed Jul. 17, 2012, which claims priority to Korean Patent Application Nos. 10-2012-0042095 filed Apr. 23, 2012, and 10-2012-0065385 filed Jun. 19, 2012,entire contents of which are incorporated herein by reference.

BACKGROUND

1. Technical Field

The present invention relates to an integrated optical sensor package and, more particularly, to an integrated optical sensor package.

2. Description of the Related Art

In various types of display devices, requirements for lightweight, thin, and large-sized display devices have gradually increased. Cathode-Ray Tube (CRT) monitors or televisions (TVs) which were generally and widely used in the past are advantageous in that, since they have been used as a principal display technology for a long period of time, there are a lot of accumulated technologies to that extent, and in that color formation capability is excellent from the standpoint of the performance of a product itself, and thus color representation can be exactly and easily realized, but there are problems in that CRT monitors or TVs are heavy and voluminous and as the size of a screen becomes larger, the volume thereof must be much greater. Therefore, research into new display technologies to replace CRT schemes has been continuously conducted.

A Thin Film Transistor-Light Emitting Diode (TFT-LED), one of such next-generation advanced display devices, has great advantages in that it has a lower power consumption than a CRT display, facilitates the implementation of a lightweight and thin structure, and does not emit harmful electromagnetic waves, and thus technology related to a TFT-LED has been greatly advanced in recent years based on the purpose thereof as a computer monitor. In addition, for recent high-quality digital broadcasting, TFT-LED displays and Organic Light-Emitting Diode (OLED) displays have attracted attention as large-screen display devices in the class size of 40 or more inches.

Since, among the above display devices, the above-described display devices are driven in response to digital signals, the correction of colors or the control of power systems may be easily implemented compared to analog equipment. In order to perform color correction, location conversion, etc., such a display device includes an illuminance sensor configured to sense surrounding brightness and a remote control sensor mounted to correct colors based on the sensed brightness levels of the illuminance sensor and control other types of equipment if necessary, and is additionally equipped with a light emitting means for indicating reception by the remote control sensor via light emission.

The remote control sensor receives a Radio Frequency (RF) signal remotely transmitted from a remote control device and applies the RF signal to the control unit of the display device. Here, the remote control sensor receives a signal in an IR band and is then operated.

Furthermore, since the light emitting means for indicating the operation of the remote control sensor via light emission is mounted in a board independent of the remote control sensor, assembly man-hours are increased.

Meanwhile, the illuminance sensor must block light in the IR band and must receive only light in the visible light band, unlike the remote control sensor.

SUMMARY

Therefore, since the conventional illuminance sensor, remote control sensor, and light emitting means must receive light components in different bands even though they are essentially added to a display device, a problem arises in that they must be configured as separate device structures in the resin of a package to block unnecessary individual light components. In this way, the illuminance sensor and the remote control sensor had to be provided as separate devices in the past, and there is the trend of a thinning and narrowing bezel structure in current TVs, a problem is created in that an installation space for devices is insufficient, manufacturing man-hours are increased, and manufacturing costs are increased.

Accordingly, the present invention has been made keeping in mind the above problems occurring in the prior art, and an aspect of the present invention is to provide an integrated optical sensor package in which an illuminance sensor for receiving light in a visible light band and a remote control sensor for receiving a light signal in an IR band are integrated so that they can receive light components in their own unique light bands without interfering with each other, thus reducing manufacturing man-hours and decreasing manufacturing costs even in the case of TVs manufactured to have thin and narrow spaces, such as thin Plasma Display Panel (PDP), LED, or OLED TVs.

Another aspect of the present invention is to provide an integrated optical sensor package in which a remote control sensor and a light emitting means for indicating the operation of the remote control sensor via light emission and/or an illuminance sensor are provided to be integrated, thus saving manufacturing costs by means of the reduction of manufacturing man-hours.

As described above, an integrated optical sensor package according to the present invention is advantageous in that an illuminance sensor for a visible light band and a remote control sensor for an IR band can be normally operated without interfering with each other, so that, upon installing an integrated optical sensor package on a device, simple assembly may be realized and assembly time may be shortened, thus reducing manufacturing man-hours, and improving space availability thanks to a spatial margin in a mounting space.

Further, the integrated optical sensor package according to the present invention is advantageous in that, upon installing an optical sensor package, into which a remote control sensor for an IR band and a light emitting means are integrated, on a device, a space may be saved to be suitable for the implementation of a small-sized device, and manufacturing costs may be reduced thanks to the shortening of assembly time and the reduction of manufacturing man-hours in a manufacturing process.

DETAILED DESCRIPTION

Figure 1:
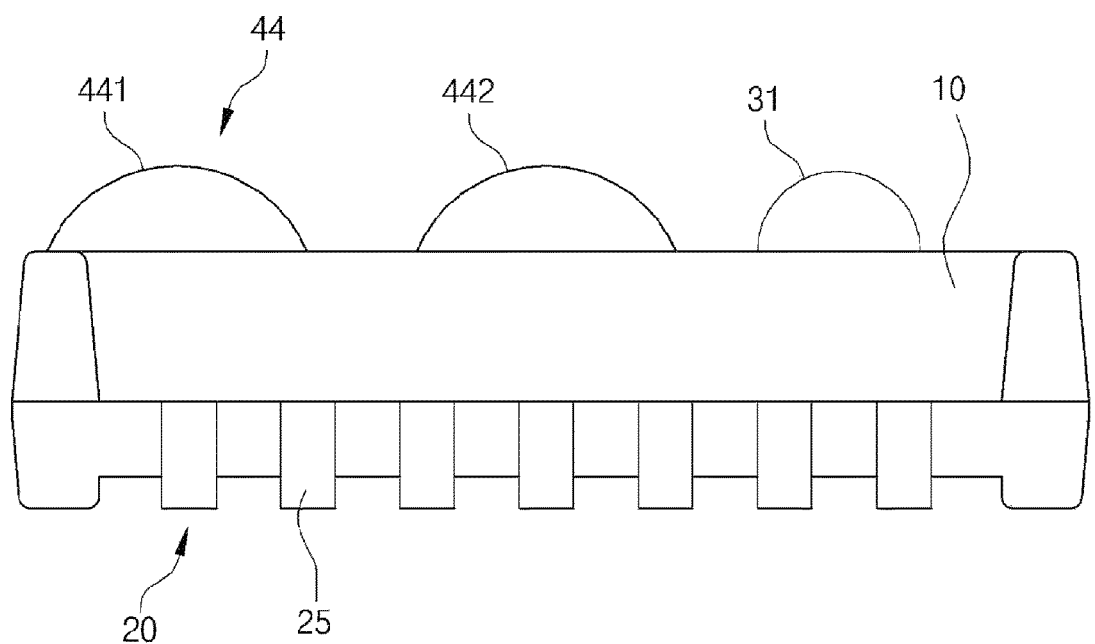
FIG. 1 is a front view showing a first embodiment of an integrated optical sensor package according to the present invention.

The present invention includes one or more embodiments to accomplish the above objects.

In a first embodiment of the present invention, the present invention provides an integrated optical sensor package, including a remote control sensor unit including one or more remote control elements for receiving a light signal in an infrared (IR) band, converting the light signal into an electrical signal, and outputting the electrical signal; an illuminance sensor for receiving a light signal in a visible light band, converting the light signal into an electrical signal, and outputting the electrical signal; a lead frame including one or more mounting parts in which the remote control elements and the illuminance sensor are respectively mounted, the lead frame having one or more output terminals for outputting the electrical signals output from the remote control elements and the illuminance sensor to outside of the lead frame; and a housing for forming an appearance so that the remote control sensor unit and the illuminance sensor are accommodated in the housing, wherein the remote control elements are coated with an IR coating agent for transmitting only light in the IR band and blocking light in bands other than the IR band, and wherein the illuminance sensor is coated with a visible light coating agent for transmitting only light in the visible light band and blocking light in bands other than the visible light band.

In a second embodiment of the present invention, the remote control sensor unit may further include one or more lenses formed to protrude upwardly from a top surface of the housing and configured to transmit light in the IR band, a shield case configured to shield the remote control sensor unit from disturbance light and electromagnetic waves within the housing, and an amplification element configured to amplify the electrical signals output from the remote control elements.

In a third embodiment of the present invention, the lead frame may include one or more mounting parts in which the remote control elements and the illuminance sensor are respectively mounted, and one or more output terminals bonded to the one or more mounting parts and configured to output electrical signals to outside of the lead frame, and the output terminals may be formed to protrude from a front surface of the housing and to be bent downwardly and extend in parallel with a bottom surface of the housing.

In a fourth embodiment of the present invention, the integrated optical sensor package may be a surface mount device type.

In a fifth embodiment of the present invention, the housing may further include a convex lens formed to protrude upwardly from a top surface of the housing just above the illuminance sensor.

In a sixth embodiment of the present invention, a integrated optical sensor package according to the present invention may include a housing molded with a light-transmitting compound; a remote control sensor unit configured to selectively receive only a light signal in an infrared (IR) band from among light signals incident into the housing, convert the received light signal into an electrical signal, and output the electrical signal; light emitting means configured to indicate that the remote control sensor unit has received the light signal in the IR band, via light emission; and a lead frame including one or more mounting parts in which the remote control sensor unit and the light emitting means are respectively mounted, the lead frame having one or more output terminals for outputting the electrical signal output from the remote control sensor unit to outside of the lead frame.

In a seventh embodiment of the present invention, the remote control sensor unit may include a remote control element for receiving light in an IR band, converting the light into an electrical signal, and outputting the electrical signal; a remote control Integrated Circuit (IC) for amplifying the electrical signal output from the remote control element; a first light-shading resin applied to a top surface of the remote control element and configured to selectively transmit only light in the IR band; and a shield case for sealing tops and opposite sides of the remote control element and the remote control IC, thus eliminating noise.

In an eighth embodiment of the present invention, the integrated optical sensor package may further include a second light-shading resin applied to a top surface of the remote control IC and configured to block light in all bands.

In a ninth embodiment of the present invention, the light emitting means may indicate reception of a remote control signal via light emission in response to a control signal applied by any one of a control unit of a device, in which the integrated optical sensor package is mounted, and the remote control sensor unit.

In a tenth embodiment of the present invention, the remote control sensor unit may further include a lens formed to protrude upwardly from a top surface of the housing and configured to transmit light in the IR band.

In an eleventh embodiment of the present invention, the integrated optical sensor package may further include an illuminance sensor mounted on the lead frame to conduct electrical signals, and configured to sense surrounding illuminance.

In a twelfth embodiment of the present invention, the illuminance sensor may be coated with a visible light coating agent for transmitting only light in the visible light band.

In a thirteenth embodiment of the present invention, the integrated optical sensor package may be a surface mount device type.

Hereinafter, preferred embodiments of an integrated optical sensor package according to the present invention will be described in detail with reference to the attached drawings.

Figure 2:
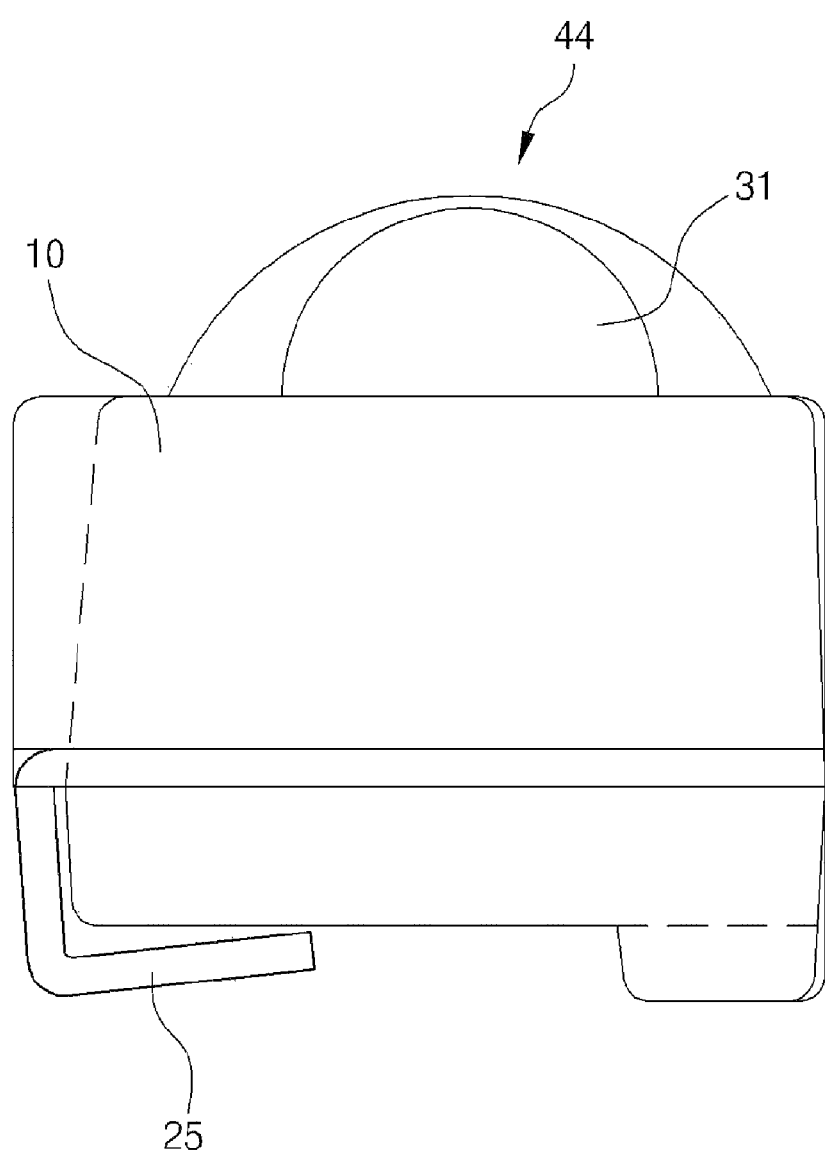
FIG. 2 is a side view showing the first embodiment of the integrated optical sensor package according to the present invention.
Figure 3:
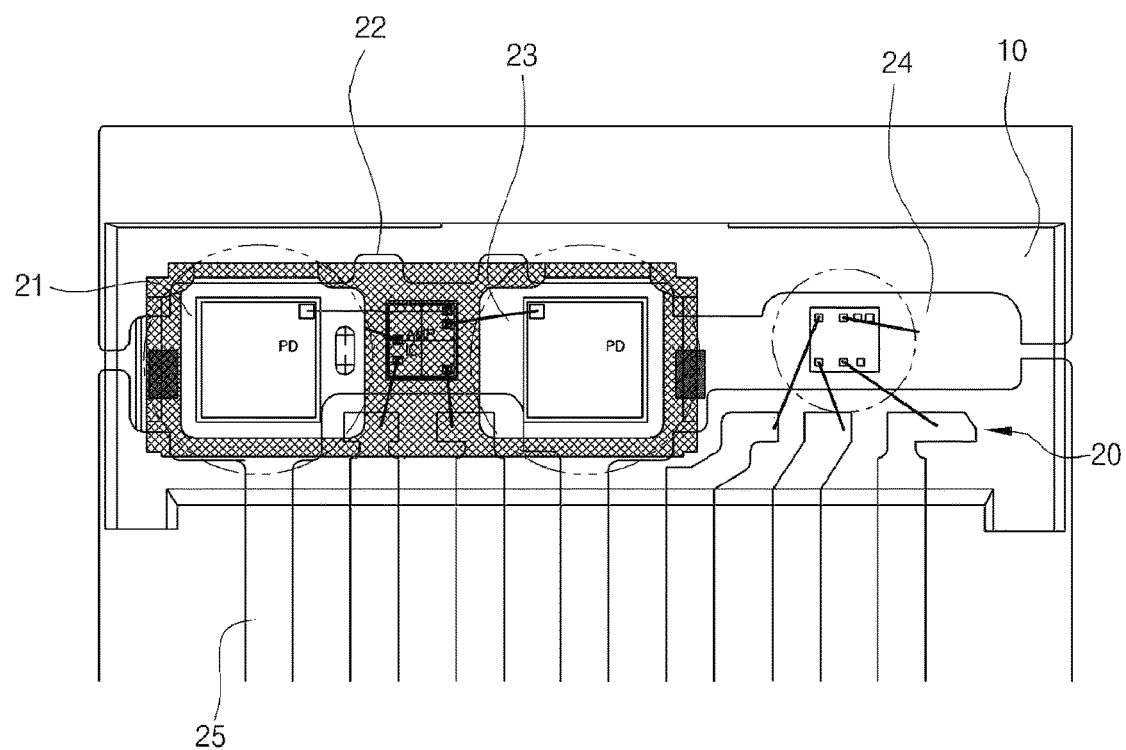
FIG. 3 is an internal plan view showing the first embodiment of the integrated optical sensor package according to the present invention.
Figure 4:
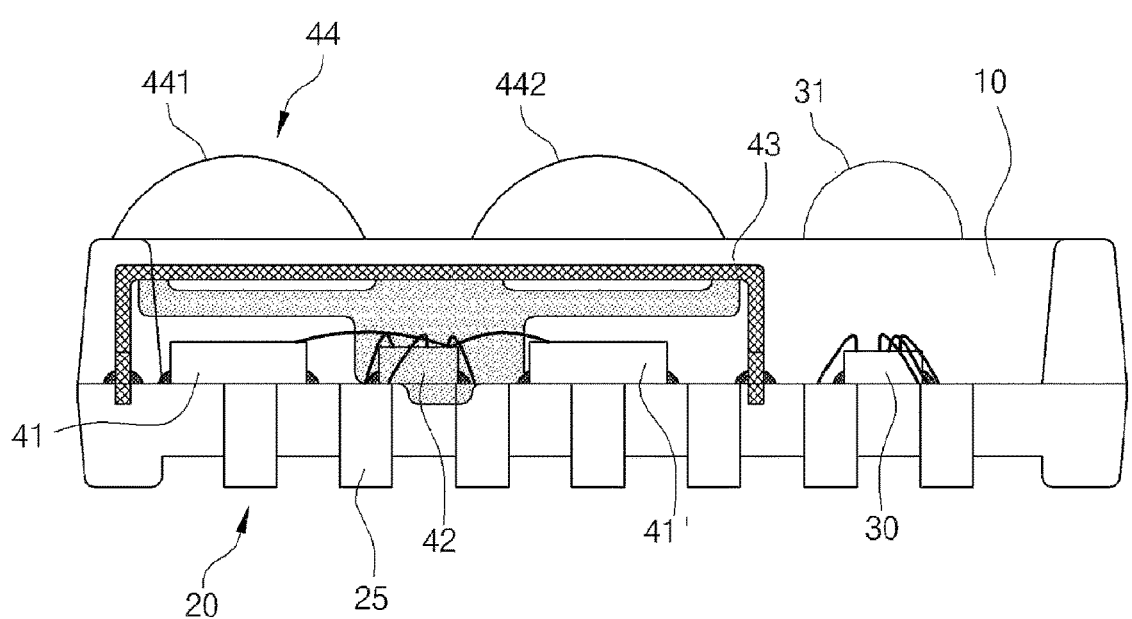
FIG. 4 is a sectional view showing the first embodiment of the integrated optical sensor package according to the present invention.

FIG. 1 is a front view showing a first embodiment of an integrated optical sensor package according to the present invention, FIG. 2 is a side view showing the first embodiment of the integrated optical sensor package according to the present invention, FIG. 3 is an internal plan view showing the first embodiment of the integrated optical sensor package according to the present invention, and FIG. 4 is a sectional view showing the first embodiment of the integrated optical sensor package according to the present invention.

Referring to FIGS. 1 to 4, the first embodiment of the integrated optical sensor package according to the present invention includes a housing 10 molded with a compound product for transmitting light in a visible light band and configured to form the appearance of a package product, a remote control sensor unit 40 configured to receive light in an infrared (IR) band, an illuminance sensor 30 configured to receive light in the visible light band, and a lead frame 20 on which the remote control sensor unit 40 and the illuminance sensor 30 are mounted.

The remote control sensor unit 40 includes remote control elements 41 and 41' for receiving light in the IR band, an amplification element 42 for amplifying electrical signals output from the remote control elements 41 and 41', a lens 44 for transmitting the light in the IR band through the housing 10, and a shield case 43 for shielding the remote control elements 41 and 41' from noise such as electromagnetic waves over the remove control elements 41 and 41'.

The lens 44 includes one or more lens and is configured such that a number of lenses identical to the number of remote control elements 41 and 41' are formed to protrude upwardly from the top surface of the housing 10. That is, the lens 44 is formed such that a first lens 441 and a second lens 442 are located just above the first remote control element 41 and the second remote control element 41', respectively.

The remote control elements 41 and 41', which are one or more elements, are individually mounted on the lead frame 20 so that they are located just below the corresponding lenses 44, and are configured to receive light in the IR band, which has been transmitted through the lenses 44, and output the received light in the form of electrical signals. In this case, the remote control elements 41 and 41' are coated with an IR coating agent for blocking light in wavelength bands other than the IR band (for example, 820 nm or more). Here, the IR coating agent blocks light in the visible light band of 380 to 820 nm, and transmits light in the IR band of 820 nm or more.

When the remote control elements 41 and 41' convert the received light in the IR band into electrical signals and output the electrical signals, the amplification element 42 amplifies the electrical signals and outputs the amplified signals through the output terminals 25 of the lead frame 20.

The shield case 43 shields the remote control elements 41 and 41' and the amplification element 42 from externally incident disturbance light and noise by hermetically sealing the tops and sides of the remote control elements 41 and 41' and the amplification element 42 within the housing 10. The shield case 43 is implemented using typically known technology, and thus a detailed description thereof will be omitted.

The lead frame 20 is configured such that first to fourth mounting parts 21 to 24 in which the illuminance sensor 30 and the remote control sensor unit 40 are respectively mounted, are formed, and such that a plurality of output terminals 25 are bonded to the first to fourth mounting parts 21 to 24 through gold wires and are configured to apply electrical signals received from the first to fourth mounting parts 21 to 24 to a circuit board.

The first to fourth mounting parts 21 to 24 include the first mounting part 21 in which the remote control element 41 is mounted, and the second mounting part 22 in which the amplification element 42 is mounted. Here, the third mounting part 23 is formed when the second remote control element 41' is added. In the fourth mounting part 24, the illuminance sensor 30 is mounted.

Further, gold wires are bonded to the first mounting part 21 and the third mounting part 23 so as to individually apply electrical signals to the amplification element 42 located in the second mounting part 22, and it is preferable that the first and third mounting parts 21 and 23 not be electrically connected to the fourth mounting part.

The output terminals 25 are connected to the first to fourth mounting parts 21 to 24 through gold wires and are configured to output electrical signals respectively output from the amplification element 42 and the illuminance sensor 30 to the outside of the circuit. In this case, as the output terminals 25 protrude from the front surface of the housing 10 and are downwardly bent and extend, they extend in parallel with the bottom surface of the housing 10. That is, the output terminals 25 are formed to be suitable for surface mount parts adhered to the surface of the circuit board of the display device.

The illuminance sensor 30 receives light in the visible light band, converts the light into an electrical signal, and outputs the electrical signal through the output terminals 25 of the lead frame 20. In this case, the illuminance sensor 30 is a semiconductor device for receiving the light in the visible light band of 380 to 820 nm and converting the light into an electrical signal, and is coated with a visible light coating agent on the outer surface of the illuminance sensor 30. The visible light coating agent transmits only light corresponding to the visible light band of 380 to 820 nm and blocks all light in the remaining bands. Furthermore, the illuminance sensor receives light in the visible light band passed through a third lens from just above the illuminance sensor. The third lens 31 is formed in a convex shape so that light in the visible light band may be condensed on the top surface of the housing and may pass through the third lens.

The first embodiment of the present invention includes the above configuration, and the operation of the first embodiment of the present invention achieved based on the above-described configuration will be described in detail below.

First, a worker mounts the integrated optical sensor package according to the present invention on the circuit board of a display device. That is, the worker bonds the output terminals 25 of the lead frame 20 to designated locations of the circuit board of the display device.

Thereafter, when a user manipulates a remote control device so as to control the screen of the display device, a light signal in an IR band is remotely transmitted from the remote control device.

Therefore, the light signal in the IR band transmitted from the remote control device is incident on the remote control elements 41 and 41' through the lens 44. In this case, surrounding visible light is incident on the remote control elements 41 and 41' through the lens 44 and the shield case 43, but it is entirely blocked by the IR coating agent applied to the remote control elements 41 and 41', and only the light in the IR band of 820 nm or more passes through the remote control elements 41 and 41', and thus only the remote signal transmitted from the remote control device may be received.

Similar to this, even if a light signal in an IR band transmitted from the remote control device passes through the housing 10 and is incident on the illuminance sensor 30, the illuminance sensor 30 blocks the light signal transmitted from the remote control device by means of a visible light coating agent applied to the outer surface thereof.

Further, the illuminance sensor 30 senses surrounding illuminance, such as the amount of light and applies a sensed signal to the control device of the display device. Here, due to the visible light coating agent, the illuminance sensor 30 blocks all light in bands other than the visible light band from light components passing through the third lens 31, and is then capable of sensing the surrounding illuminance using light in a pure visible light band.

In this way, even if the illuminance sensor 30 and the remote control elements 41 and 41' for receiving light components in the visible light band and the IR band, respectively, are implemented in a single package, the present invention may selectively receive light components in different bands, which are incident into the housing 10, thus preventing malfunctioning from occurring due to interference or noise between the light components.

Therefore, since the illuminance sensor and the remote control sensor are integrated without causing mutual interference, manufacturers may obtain the effect of reducing manufacturing processes and shortening assembly time, so that manufacturing costs may be reduced, thus providing products to consumers at lower costs.

Further, the present invention includes second and third embodiments in which a remote control sensor and a light emitting means and/or an illuminance sensor are integrated into a single structure, unlike the above-described first embodiment. Below, the configurations and operations of the second and third embodiments will be described in detail with reference to FIGS. 5 to 9. Here, the present invention is described by assigning reference numerals different from those of the first embodiment to the second and third embodiments in FIGS. 5 to 9.

Figure 5:
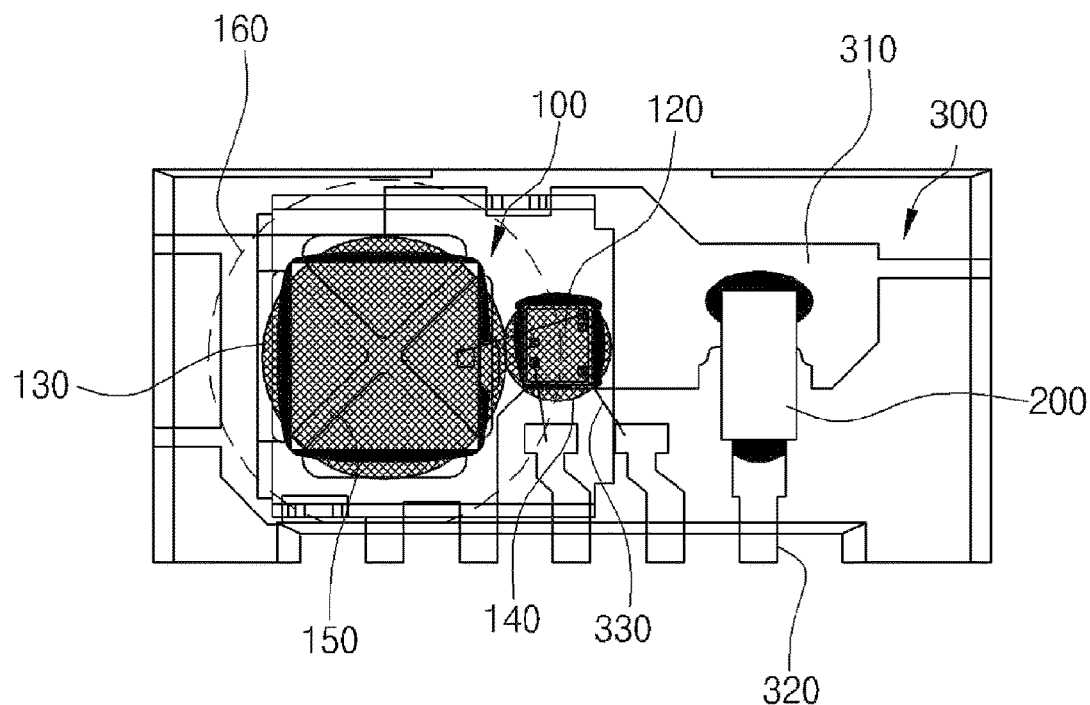
FIG. 5 is a plan view showing a second embodiment of an integrated optical sensor package according to the present invention.
Figure 6:
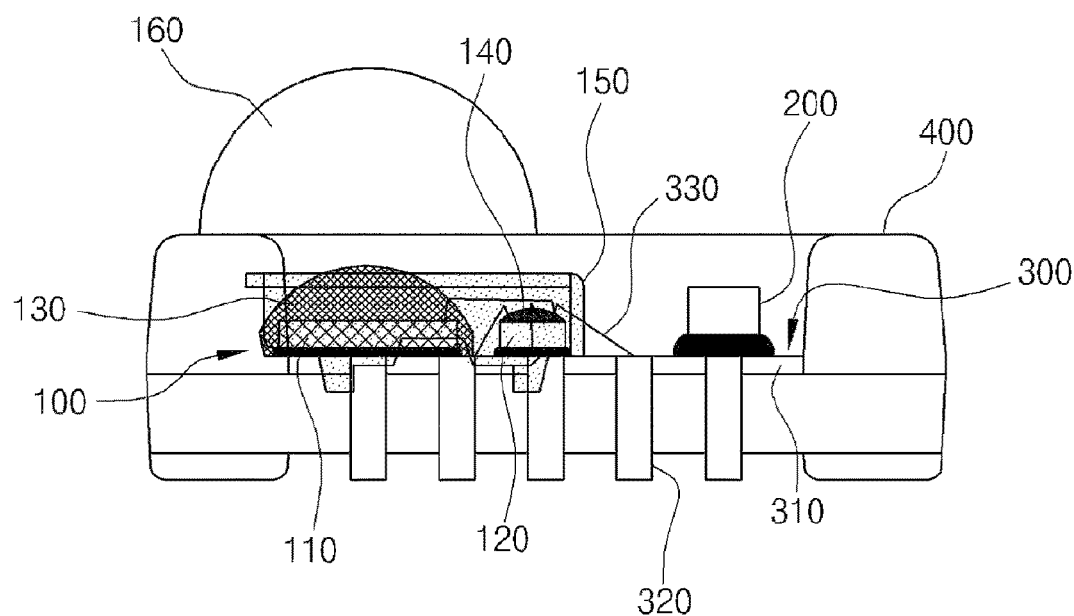
FIG. 6 is a side view showing the second embodiment of the integrated optical sensor package according to the present invention.

FIG. 5 is a plan view showing a second embodiment of an integrated optical sensor package according to the present invention, and FIG. 6 is a side view showing the second embodiment of the integrated optical sensor package according to the present invention.

Referring to FIGS. 5 and 6, the second embodiment of the integrated optical sensor package according to the present invention includes a housing 400 molded with a compound made of a light-transmitting material and configured to form the appearance of a package product, a remote control sensor unit 100 configured to receive a remote control signal in an IR band which is remotely transmitted, a light emitting means 200 configured to indicate whether the remote control sensor unit 100 has received the remote control signal, via light emission, and a lead frame 300 configured to mount and support the remote control sensor unit 100 and the light emitting means 200.

The housing 400 is manufactured using a compound made of a light-transmitting material. In this case, the housing 400 transmits all light in the visible light band.

The remote control sensor unit 100 includes a remote control element 110 configured to receive a light signal in the IR band, a remote control Integrated Circuit (IC) 120 configured to amplify a reception signal which is received and output from the remote control element 110, a first light-shading resin 130 applied to the top of the remote control element 110 and configured to transmit only the light in the IR band, a second light-shading resin 140 applied to the top of the remote control IC 120 and configured to block light in all bands, a shield case 150 configured to shield the remote control sensor unit from electromagnetic waves, and a lens 160 configured to transmit the light in the IR band through the top surface of the housing 400.

The remote control element 110 receives the light signal in the IR band and outputs the light signal in the form of an electrical signal to the remote control IC 120.

The remote control IC 120 amplifies the electrical signal output from the remote control element 110, outputs the amplified signal to a device (for example, the control unit of a TV) connected to the remote control sensor unit 100, and controls the light emitting means 200 so that the reception of the remote control signal is indicated via light emission.

As another application example, the light emitting means 200 may also be applied by the control unit of a device (for example, a TV) in which the integrated optical sensor package is installed rather than by the remote control IC 120.

The lens 160 may be manufactured using a light-shading resin (for example, a first light-shading resin) which is formed in a convex or planar shape up to the top surface of the housing 400 molded with a light-transmitting material and which is configured to block light in the visible light band and selectively transmit only light in the IR band, or may be manufactured so that light in all bands is transmitted.

Since, in the present invention, the first light-shading resin 130 which will be described later selectively transmits only light in the IR band, it is also possible to set the lens 160 so that it transmits light in all bands. Here, since the light-shading resin is a typically known product, a detailed description thereof will be omitted.

Further, the lens 160 transmits light in all bands and is preferably located just above the remote control sensor unit 100.

The shield case 150 is fixed in a bent shape over the top of the remote control element 110 and configured to shield the remote control element from noise such as electromagnetic waves.

In the lead frame 300, a mounting part 310 in which the remote control sensor unit 100 and the light emitting means 200 are seated and are adhered to each other using aging paste is formed, and a plurality of output terminals 320 which output electrical signals output from the mounting part 310 to the circuit board are formed. Furthermore, the output terminals 320 and the mounting part 310 are electrically connected to the remote control element 110, the light emitting means 200, and the remote control IC 120 through wires 330.

The light emitting means 200 indicates the reception of the remote control element 110 via light emission in response to a control signal from the remote control IC 120. The light emitting means 200 emits white light or light having another color in response to the control signal from the remote control IC 120, thus indicating, via light emission, that the remote control element 110 receives a remote signal from the remote control device located at a long distance.

As the light emitting means 200, any one of an LED and an LED chip, for example, may also be selected.

The first light-shading resin 130 is applied to the top surface of the remote control element 110 and is configured to block all light in bands other than the IR band (for example, 820 nm or more). The first light-shading resin 130 is implemented using a product purchased and used by those skilled in the art, and a detailed product name and data thereof are omitted.

The second light-shading resin 140 is applied to the top surface of the remote control IC 120 and is configured to block light. Preferably, the second light-shading resin 140 blocks light in all bands including the IR band.

As described above, the second embodiment of the present invention is configured such that the remote control element 110 and the light emitting means 200 are integrated into a single structure. Therefore, through a single task, two types of parts may be mounted in an assembly process for installing an optical sensor package, into which the remote control element 110 and the light emitting means 200 are integrated, in an actual product (for example, a TV, an air-conditioner, or the like). That is, man-hours may be reduced to half compared to a conventional case where the remote control element and the light emitting means 200 are separately installed.

Further, in the third embodiment of the present invention, the remote control element 110, the illuminance sensor 500, and the light emitting means 200 are integrated into a single structure. The illuminance sensor 500 is a sensor for sensing surrounding brightness so that the video quality or brightness of the screen of a TV may be automatically adjusted according to the amount of light of the surroundings.

Such an illuminance sensor 500 has been applied to electric home appliances or the like equipped with a display, which are currently released. As described above, since the remote control element 110 and the illuminance sensor 500 receive and sense light in different bands, it is difficult to simultaneously apply the remote control element 110 and the illuminance sensor 500.

However, in the third embodiment of the present invention, the remote control element 110 and the illuminance sensor 500 which receive light in different bands may be integrated with the light emitting means 200 into a single structure. A detailed description thereof will be made with reference to FIGS. 7 to 9.

Figure 7:
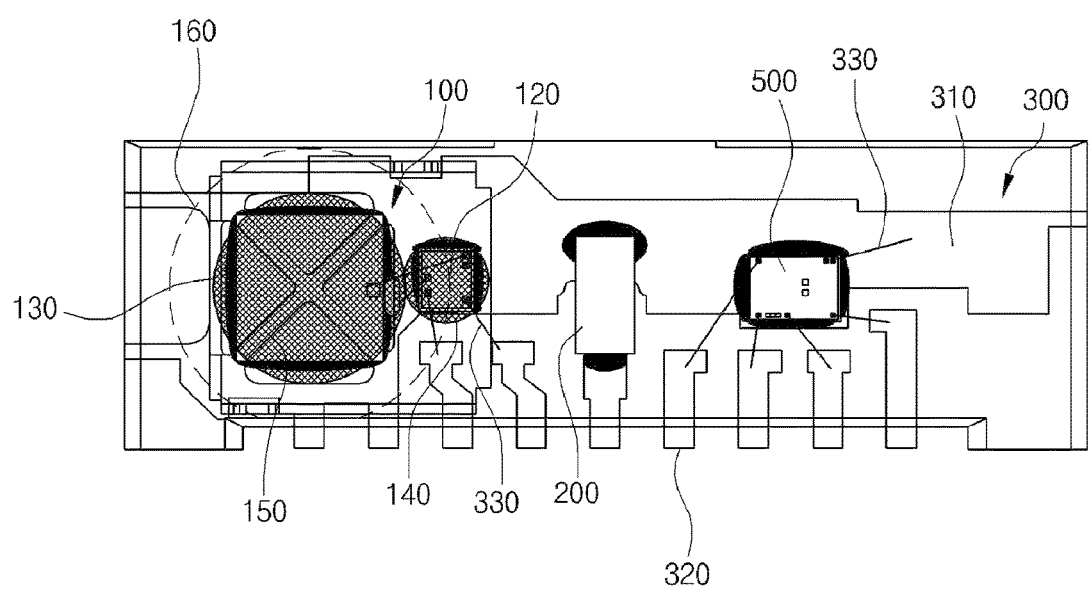
FIG. 7 is a plan view showing a third embodiment of an integrated optical sensor package according to the present invention.
Figure 8:
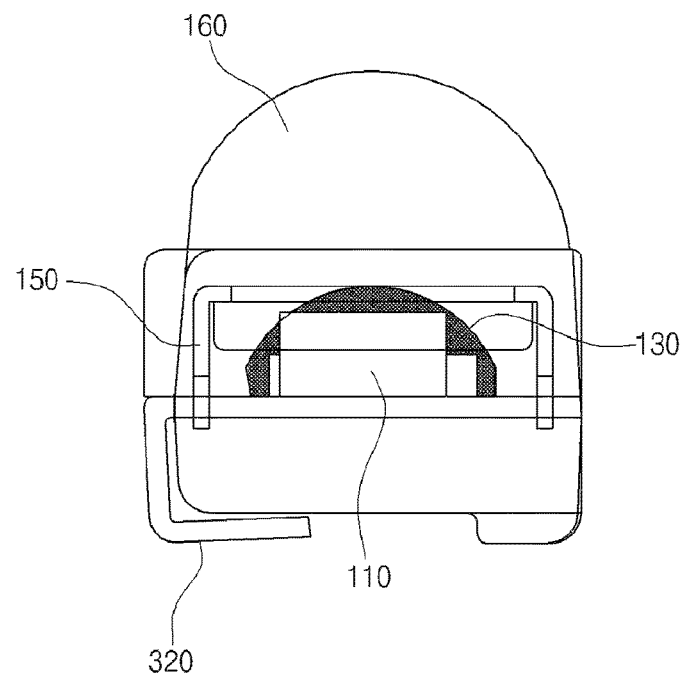
FIG. 8 is a side sectional view showing the third embodiment of the integrated optical sensor package according to the present invention.
Figure 9:
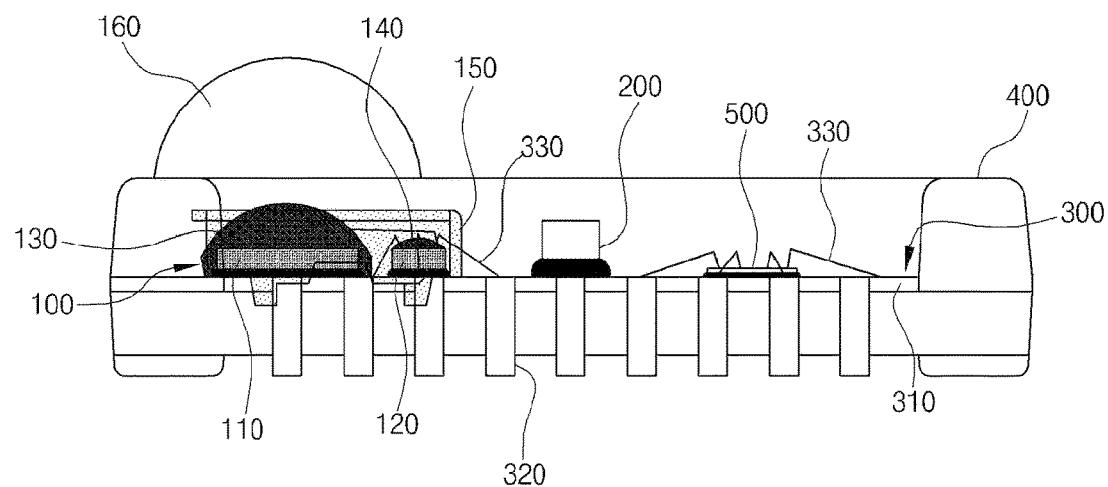
FIG. 9 is a side view showing the third embodiment of the integrated optical sensor package according to the present invention.

FIG. 7 is a plan view showing a third embodiment of an integrated optical sensor package according to the present invention, FIG. 8 is a side sectional view showing the third embodiment of the integrated optical sensor package according to the present invention, and FIG. 9 is a side view showing the third embodiment of the integrated optical sensor package according to the present invention.

Here, a description will be made in which the same reference numerals are assigned to the configuration of the third embodiment of the present invention shown in FIGS. 7 to 9 to designate the same components in the above-described second embodiment.

Referring to FIGS. 7 to 9, the third embodiment of the integrated optical sensor package according to the present invention includes a housing 400 molded with a compound product for transmitting light in a visible light band and configured to form the appearance of a package product, a remote control sensor unit 100 configured to receive light in an IR band, an illuminance sensor 500 configured to receive light in the visible light band, a light emitting means 200 configured to indicate the reception of the light in the IR band by the remote control sensor unit 100, via light emission, and a lead frame 300 on which the remote control sensor unit 100, the illuminance sensor 500, and the light emitting means 200 are mounted.

The remote control sensor unit 100 includes remote control elements 110 for receiving light in the IR band, a remote control Integrated Circuit (IC) 120 for amplifying electrical signals output from the remote control elements 110, a lens 160 for transmitting light through the housing 400, a shield case 150 for shielding each remote control element 110 from noise such as electromagnetic waves over the remote control element 110, a first light-shading resin 130 for blocking light in bands other than the IR band, and a second light-shading resin 140 for blocking light in all bands.

The lens 160 is configured such that a number of lenses identical to the number of remote control elements 110 are formed in a convex shape to protrude upwardly from the top surface of the housing 400.

Each remote control element 110 is mounted on the lead frame 300 so that it is located just below the lens 160, and is configured to output an electrical signal proportional to the amount of light in the IR band, which has passed through the first light-shading resin 130.

The first light-shading resin 130 is applied to the top surface of the remote control element 110 at a thickness of 0.3 mm or more and is configured to block light in bands other than the IR band (for example, 820 nm or more), which can be received by the remote control element 110. For example, the first light-shading resin 130 blocks light in the visible light band of 380 to 820 nm and selectively transmits only light in the IR band of 820 nm or more.

The remote control IC 120 amplifies the electrical signal output from the remote control element 110 and outputs the amplified signal through the output terminals 320 of the lead frame 300. Further, when the remote control element 110 outputs a photoelectrically converted-electrical signal, the remote control IC 120 controls the light emitting means 200 so that it indicates the output of the electrical signal via light emission. Here, in the remote control IC 120, light in all bands is blocked by the second light-shading resin 140.

The shield case 150 shields the remote control element 110 from externally incident disturbance light and noise by hermetically sealing the tops and sides of the remote control element 110 and the remote control IC 120. In this regard, the shield case 150 is formed in an L-shape, and has the shape of a partially exposed region because the planar top surface thereof is formed in the shape of a cross. Therefore, if the first light-shading resin 130 is applied after the shield case 150 has been fixed over the remote control element 110, the first light-shading resin 130 may be applied to the top surface of the remote control element 110 through an open area of the shield case 150.

The lead frame 300 is configured such that mounting parts in which the illuminance sensor 500, the remote control sensor unit 100, and the light emitting means 200 are respectively mounted are formed, and such that a plurality of output terminals 320 are bonded to the mounting parts 310 through respective wires 330 and externally extend so as to apply electrical signals to the circuit board.

The output terminals 320 are connected through the wires 330 and transfer electrical signals applied by the remote control IC 120, the illuminance sensor 500, and the light emitting means 200, respectively. The output terminals 320 are preferably formed to protrude from the front surface or opposite side surfaces of the housing 400 and to be bent downwardly towards the bottom surface of the housing 400 and extend. That is, each of the output terminals 320 is formed in a Surface Mount Device (SMD) type on which it is adhered to the surface of the circuit board of the display device.

The illuminance sensor 500 receives light in the visible light band, converts the light into an electrical signal, and outputs the electrical signal through the output terminals 320 of the lead frame 300. Here, the illuminance sensor 500, which is a semiconductor device for receiving light in the visible light band of 380 to 740 nm and converting the light into an electrical signal, is coated with a visible light coating agent on the outer surface thereof. The visible light coating agent transmits only light corresponding to the visible light band and blocks all light in the remaining bands. In addition, the illuminance sensor 500 receives the light in the visible light band, which has passed through the housing 400.

The present invention includes the above-described configuration and the operation of the present invention will be described in detail with reference to the third embodiment.

First, a worker mounts the integrated optical sensor package according to the present invention on the circuit board of the display device. For example, the worker bonds the output terminals 320 of the lead frame 300 to designated locations of the circuit board of the display device. Here, the integrated optical sensor package is configured such that the remote control sensor unit 100, the illuminance sensor 500, and the light emitting means 200 are integrated into a single structure.

After assembly has been completed in this way, if a user manipulates a remote control device required to control the screen of the display device, a light signal in the IR band is transmitted from the remote control device.

Then, the light signal in the IR band, which has been transmitted from the remote control device, is incident on the remote control element 110 through the lens 160. In this case, surrounding visible light passes through the housing 400 and is incident into the housing, but it is blocked by the first light-shading resin 130 and the second light-shading resin 140 without being incident on the remote control element 110 and the remote control IC 120.

Therefore, the remote control element 110 receives only the light signal in the IR band, which is received from the remote control device, and prevents light signals in the remaining bands from being incident thereinto. Therefore, the remote control element 110 outputs an electrical signal proportional to the incident light signal in the IR band to the remote control IC 120.

Further, the remote control IC 120 amplifies the electrical signal output from the remote control element 110, outputs the amplified electrical signal to the outside through the output terminals 320, and allows the light emitting means 200 to indicate the reception of the remote control signal via light emission by causing the light emitting means to emit light.

Alternatively, the light emitting means 200 may also perform indication based on light emission under the control of the control unit of the mounted device as the output signal of the remote control IC 120 is applied to the control unit (not shown) of the device, without performing indication based on light emission in response to a control signal from the remote control IC 120. This corresponds to any one of a plurality of application embodiments including the technical spirit of the present invention modifiable according to the intention of a designer or a manufacturer.

In this case, even if the light signal in the IR band, transmitted from the remote control device (not shown) passes through and is incident into the housing 400, the illuminance sensor 500 blocks the light signal in the IR band transmitted from the remote control device (not shown) using a visible light coating agent applied to the outer surface of the illuminance sensor, and receives only light in the visible light band and then senses the amount of surrounding light.

As described above, even if the illuminance sensor 500 and the remote control element 110 for receiving light in the visible light band and light in the IR band, respectively, and the light emitting means 200 are configured in a single package, the present invention may selectively receive only light in a set band even when light components in different bands are incident into a housing, thus preventing malfunctioning caused by mutual interference or noise.

As described above, the present invention is configured such that a remote control sensor, an illuminance sensor and/or a light emitting means are integrated into a single structure, and in particular, the remote control sensor and the illuminance sensor can be operated without interfering with each other, and the remote control sensor and the light emitting means are formed to be integrated into a single structure, so that manufacturing processes may be reduced, and assembly time may be shortened, and then manufacturing costs may be reduced. Accordingly, since products may be provided to consumers at lower costs, the present invention may be highly applicable to related industrial fields.

The invention claimed is:

1. An integrated optical sensor package, comprising:
a housing made of a light-transmitting compound;
a remote control sensor unit to selectively receive only a light signal in an infrared (IR) band from among light signals incident into the housing, convert the received light signal into an electrical signal, and output the electrical signal;
a light emitting unit to indicate that the remote control sensor unit has received the light signal in the IR band, via light emission;
an illuminance sensor coated with a visible light coating agent for transmitting only light in the visible light band; and
a lead frame including one or more mounting parts in which the remote control sensor unit, the illuminance sensor and the light emitting unit are respectively mounted, the lead frame having one or more output terminals for outputting the electrical signal output from the remote control sensor unit to outside of the lead frame,
wherein the remote control sensor unit includes:
a remote control element for receiving light in an IR band, converting the light into an electrical signal, and outputting the electrical signal;
a remote control integrated circuit (IC) for amplifying the electrical signal output from the remote control element;
a first light-shading resin applied to a top surface of the remote control element to selectively transmit only light in the IR band; and
a second light-shading resin applied to a top surface of the remote control integrated circuit to block light incident on the remote control integrated circuit in all bands to prevent noise caused by light incident into the housing.

2. The integrated optical sensor package of claim 1, wherein the remote control sensor unit further includes:
a shield case for sealing tops and opposite sides of the remote control element and the remote control IC, thus eliminating noise.

3. The integrated optical sensor package of claim 1, wherein the light emitting unit indicates reception of a remote control signal via light emission in response to a control signal applied by any one of a control unit of a device, in which the integrated optical sensor package is mounted, and the remote control sensor unit.

4. The integrated optical sensor package of claim 1, wherein the remote control sensor unit further includes a lens formed to protrude upwardly from a top surface of the housing and to transmit light in the IR band.

5. The integrated optical sensor package of claim 1, wherein the integrated optical sensor package is a surface mount device type.

\* \* \* \* \*